(12) United States Patent
Figuet et al.

(10) Patent No.: US 9,646,825 B2
(45) Date of Patent: May 9, 2017

(54) METHOD FOR FABRICATING A COMPOSITE STRUCTURE TO BE SEPARATED BY EXFOLIATION

(75) Inventors: Christophe Figuet, Crolles (FR); Christophe Gourdel, Saint Maximin (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/345,558

(22) PCT Filed: Jul. 18, 2012

(86) PCT No.: PCT/IB2012/001405
§ 371 (c)(1),
(2), (4) Date: Mar. 18, 2014

(87) PCT Pub. No.: WO2013/041926
PCT Pub. Date: Mar. 28, 2013

(65) Prior Publication Data
US 2014/0339681 A1  Nov. 20, 2014

(30) Foreign Application Priority Data
Sep. 20, 2011  (FR) .................................. 11 58330

(51) Int. Cl.
*H01L 21/31* (2006.01)
*H01L 21/469* (2006.01)
(Continued)

(52) U.S. Cl.
CPC ...... *H01L 21/02345* (2013.01); *H01L 21/263* (2013.01); *H01L 21/304* (2013.01);
(Continued)

(58) Field of Classification Search
USPC .................................. 438/458, 463, 464, 759
See application file for complete search history.

(56) References Cited

U.S. PATENT DOCUMENTS

| 5,811,191 A | 9/1998 | Neuman et al. |
| 7,648,741 B2 * | 1/2010 | Nguyen ................. H05K 3/046 427/595 |

(Continued)

FOREIGN PATENT DOCUMENTS

| CN | 1998071 A | 7/2007 |
| EP | 0 858 110 A1 | 12/1998 |
| WO | 2011073716 A1 | 6/2011 |

OTHER PUBLICATIONS

International Written Opinion for International Application No. PCT/IB2012/001405 dated Sep. 25, 2012, 4 pages.

(Continued)

*Primary Examiner* — Telly Green
(74) *Attorney, Agent, or Firm* — TraskBritt

(57) ABSTRACT

The invention relates to a method for fabricating a composite structure comprising a layer to be separated by irradiation, the method comprising the formation of a stack containing: a support substrate formed from a material that is at least partially transparent at a determined wavelength; a layer to be separated; and a separation layer interposed between the support substrate and the layer to be separated, the separation layer being adapted to be separated by exfoliation under the action of radiation having a wavelength corresponding to the determined wavelength. Furthermore, the method comprises, during the step for forming the composite structure, a treatment step modifying the optical properties in reflection at an interface between the support substrate and the separation layer or on an upper face of the support substrate.

16 Claims, 5 Drawing Sheets

(51) Int. Cl.
*H01L 21/02* (2006.01)
*H01L 21/762* (2006.01)
*H01L 21/263* (2006.01)
*H01L 21/304* (2006.01)
*H01L 21/3105* (2006.01)
*H01L 23/00* (2006.01)
*H01L 29/06* (2006.01)

(52) U.S. Cl.
CPC .... *H01L 21/3105* (2013.01); *H01L 21/76254* (2013.01); *H01L 23/564* (2013.01); *H01L 29/0657* (2013.01); *H01L 2924/0002* (2013.01)

(56) References Cited

U.S. PATENT DOCUMENTS

| | | | |
|---|---|---|---|
| 7,846,816 B2* | 12/2010 | Bruel | H01L 21/76254 257/E21.437 |
| 8,993,410 B2* | 3/2015 | Henley | H01L 21/67092 438/458 |
| 2004/0071422 A1 | 4/2004 | Aylward et al. | |
| 2004/0110395 A1 | 6/2004 | Ueda et al. | |
| 2006/0030122 A1 | 2/2006 | Shimoda et al. | |
| 2006/0263725 A1* | 11/2006 | Nguyen | H05K 3/046 430/311 |
| 2007/0116966 A1 | 5/2007 | Mellott et al. | |
| 2009/0053877 A1* | 2/2009 | Bruel | H01L 21/76254 438/463 |
| 2010/0083999 A1 | 4/2010 | Hovel | |
| 2010/0330731 A1 | 12/2010 | Agarwal et al. | |
| 2011/0120554 A1 | 5/2011 | Chhajed et al. | |
| 2012/0234887 A1* | 9/2012 | Henley | H01L 21/67092 225/1 |

OTHER PUBLICATIONS

International Preliminary Report on Patentability for International Application No. PCT/IB2012/001405 dated Mar. 25, 2014, 5 pages.
Singapore Search Report and Written Opinion for Application No. 11201400695Y dated Jun. 19, 2015, 4 pages.
Yamada et al., "Characterization of antireflection moth eye film on crystalline silicon photovoltaic module," Optics Express, vol. 19, Issue S2, pp. A118 A125.
International Search Report for International Application No. PCT/IB2012/001405 dated Sep. 25, 2012, 3 pages.
Taiwan Search Report for Taiwanese Application No. 101128670 dated Apr. 28, 2016, 1 page.

* cited by examiner

METHOD FOR FABRICATING A COMPOSITE STRUCTURE TO BE SEPARATED BY EXFOLIATION

CROSS-REFERENCE TO RELATED APPLICATIONS

This application is a national phase entry under 35 U.S.C. §371 of International Patent Application PCT/IB2012/001405, filed Jul. 18, 2012, designating the United States of America and published in English as International Patent Publication WO 2013/041926 A1 on Mar. 28, 2013, which claims the benefit under Article 8 of the Patent Cooperation Treaty and under 35 U.S.C. §119(e) to French Patent Application Serial No. 1158330, filed Sep. 20, 2011, the disclosure of which is hereby incorporated herein in its entirety by this reference.

TECHNICAL FIELD

The invention concerns the field of the fabrication of composite (or multilayer) semiconductor structures, and relates more particularly to methods of separation by exfoliation, making it possible to detach one or more layers of a composite structure, for example, in the scope of transferring layers from an initial support to a final support.

BACKGROUND

In the field of the fabrication of composite structures, it is often useful to be able to assemble and/or separate films or layers, such as, for example, semiconducting or insulating layers. Such separations are, in particular, necessary in order to transfer a layer from an initial substrate to a final substrate. These transfers are carried out, for example, during the implementation of three-dimensional component technology, which involves the formation of electronic, photovoltaic and/or optoelectronic components on both faces ("front face" and "rear face") of the same layer (3D integration). Layer transfers are also carried out in order to transfer circuits during the fabrication of rear-face illuminated imagers. The transfer of layers is also useful for changing the substrate on which one or more layers are formed, so that the new substrate meets requirements in terms particularly of cost, physical characteristics (cell size, thermal stability, . . . ), etc.

A method of thin-film transfer is described, for example, in patent document EP 0 858 110. This method provides, in particular, the separation of a film with the aid of a technique of separation by exfoliation, this technique requiring, in particular, irradiation of a composite structure through a transparent substrate.

An exemplary embodiment of a method for fabricating a composite structure (steps S1 and S2) and of a method of separation by exfoliation (steps S3 and S4) will now be described with reference to FIG. 1.

First, a so-called separation layer 10 (or optical absorption layer) is assembled by bonding on one of the faces of a support substrate 5 (step S1). As indicated in more detail below, the support substrate 5 is at least partially transparent at a predetermined wavelength.

A layer 15 (also referred to as "layer to be separated") is subsequently assembled by bonding on the face of the separation layer 10 on the opposite side from the one in contact with the support substrate 5, so as to obtain a composite structure 25 (step S2).

It will be noted that the assembly of the layers 5, 10 and 15 during steps S1 and S2 may be carried out by means of any suitable assembly technique, such as, for example, a technique of molecular adhesion bonding or involving an intermediate bonding layer.

Furthermore, the layers 10 and 15 are not necessarily assembled by bonding in order to form the composite structure 25. As a variant, at least one of the layers 10 and 15 may be formed by means of a suitable deposition technique. The separation layer 10 may, for example, be formed by PECVD ("plasma-enhanced chemical vapor deposition") or LPCVD ("low-pressure CVD") deposition.

Once the composite structure 25 has been formed, separation of the separation layer 10 may be carried out by exfoliation. This method makes it possible to detach the layer 15 from the support substrate 5.

To this end, the separation layer 10 is irradiated by means of electromagnetic radiation 20 through the support substrate 5 (step S3). The radiation 20 is at a wavelength for which the support substrate 5 is at least partially transparent. Here, "partially transparent" is intended to mean a substrate whose transmittance at the wavelength in question is at least 10%, and preferably greater than or equal to 50%. As indicated below, the required level of transparency will vary according to the amount of energy of the electromagnetic beam 20, which is received by the separation layer 10.

During this irradiation step S3, the separation layer 10 absorbs the incident light passing through the interface 8 between the support substrate 5 and the separation layer 10. This irradiation leads to a reduction or elimination of the adhesion forces between the atoms or molecules in the material of the separation layer 10. This is because, under the action of the radiation 20, the material constituting the separation layer 10 is subjected to photochemical and/or thermal excitation, which leads to the breaking of a chain of atoms or molecules. These breaks thus cause separation of the separation layer 10 by exfoliation, either in the actual thickness of the layer 10 (so-called "internal" exfoliation) or at the interface 8 between the layer 10 and the support substrate 5 or at the interface 12 between the separation layer 10 and the layer 15 to be separated ("interfacial" exfoliation). This exfoliation phenomenon may also involve one or more gases released by the material of the separation layer 10 under the action of the radiation 20.

It should be noted that the separation induced by the radiation 20 does not necessarily lead to detachment or actual separation in the separation layer 10 (or at one of the interfaces 8 and 12), but may simply lead to weakening of the material of the separation layer 10. In the latter case, the application of additional energy (for example, in the form of mechanical forces) is necessary in order to obtain the actual detachment between the support substrate 5 and the layer 15 (if such detachment is actually desired).

Once the substrate 5 and the layer 15 have been fully separated (step S4), the support substrate 5 may be recycled with a view to forming a new composite structure.

Currently, the composite structures produced according to the layout of FIG. 1 generally have one of the following compositions:

$GaN/Al_2O_3$, which corresponds to a separation layer 10 consisting of GaN and a support substrate 5 consisting of sapphire;

$Si_3N_4/Al_2O_3$, which corresponds to a separation layer 10 consisting of $Si_3N_4$ and a support substrate 5 consisting of sapphire.

With regard to these compositions, the results in terms of quality of separation by exfoliation are, in general, satisfactory. When layers of GaN deposited on a sapphire substrate are separated, for example, the application of the radiation 20 (at a wavelength of typically between 190 nm and 250 nm) takes place under good conditions and the separation is obtained without any particular difficulty.

The applicants have, however, observed that the results can be significantly degraded when this separation method is applied to other compositions of the composite structure 25. For example, the separation by exfoliation is much more difficult for a composite structure 25 of the $SiO_2/Si$ type (i.e., silicon dioxide on silicon). The applicants have observed large variations in terms of quality of separation by exfoliation as a function of the batches studied and, in general, less uniform separations requiring more exposure to radiation.

There is, therefore a current need for composite structures better suited to the method of separation by exfoliation, irrespective of the composition of the composite structures in question. There is, in particular, a need for composite structures of unconventional composition adapted to be separated by exfoliation under good conditions.

BRIEF SUMMARY

To this end, the present invention relates to a method for fabricating a composite structure comprising a layer to be separated by irradiation, the method comprising the formation of a stack containing at least:
- a support substrate formed from a material that is at least partially transparent at a determined wavelength;
- the layer to be separated; and
- a separation layer interposed between the support substrate and the layer to be separated, the separation layer being adapted to be separated by exfoliation under the action of radiation having a wavelength corresponding to the determined wavelength;

the fabrication method furthermore comprising, during the step for forming the composite stack, at least one treatment step modifying the optical properties in reflection at the interface between the support substrate and the separation layer or on the upper face of the support substrate on the opposite side from the face of the substrate in contact with the separation layer.

It is then possible to apply a method of separation by exfoliation to the composite structure of the invention, in order to detach the layer to be separated from the support substrate. To this end, an electromagnetic wave is applied to the support substrate, which partially transmits it to the underlying separation layer.

The treatment step modifying the optical properties in reflection advantageously makes it possible, during the method of separation by exfoliation, to limit or avoid reflection of the light beams at the interface or interfaces treated in this way.

The composite structure of the invention thus makes it possible to reduce the variations in transmitted energy as a function of the thickness of the support substrate during the method of separation by exfoliation, and to maximize the amount of energy actually transmitted into the separation layer. The quality and reproducibility of the separation by exfoliation between the support substrate and the layer to be separated are thus greatly improved. The method makes it possible, in particular, to carry out separations by exfoliation on composite structures that have compositions different from those generally used and that are particularly sensitive to optical interference.

According to a first embodiment of the invention, the treatment step comprises the formation of at least one antireflection layer at the interface between the support substrate and the separation layer and/or on the upper face of the support substrate.

The effect of this antireflection layer is to combine two reflections in phase opposition so that they are destructive, which advantageously makes it possible to reduce or prevent any reflection of the light radiation transmitted by the support substrate during the method of separation by exfoliation. The transmission of the light energy through the support substrate to the separation layer is, therefore, maximized, which makes it possible to significantly improve the quality of the separation by exfoliation.

The refractive index n2 of the antireflection layer is preferably substantially equal to $\sqrt{n1 \times n3}$, where n1 and n3 are, respectively, the refractive index of the support substrate and of the separation layer. Even more preferably, $n2=\sqrt{n1 \times n3}$.

Setting the optical index n2 at a value close (for example, to within +10%, or even to within ±5%) or equal to $\sqrt{n1 \times n3}$, advantageously makes it possible to limit undesirable reflections during the irradiation step of the method of separation by exfoliation to a minimum.

Furthermore, the separation layer may comprise a heating sublayer and an exfoliation sublayer, the exfoliation sublayer being adapted to decompose under the action of heating induced by the heating sublayer.

In a particular embodiment, the support substrate consists of silicon, the heating sublayer consists of silicon dioxide, the exfoliation sublayer consists of $Si_3N_4$ and the antireflection layer consists of SiON, the refractive index of which is substantially equal to (or equal to) 2.61.

According to a variant of the first embodiment, when an antireflection layer is formed at the interface between the support substrate and the separation layer, the composition of the antireflection layer varies gradually over its thickness so that its refractive index n2 is equal to n1 at its interface with the support substrate and is equal to n3 at its interface with the separation layer.

This variant advantageously makes it possible to avoid significant jumps in optical index at the interfaces involved in the composite structure. The reflections at the interface between the antireflection layer and the support substrate are thus minimized.

According to this variant, the separation layer may comprise a heating sublayer consisting of silicon dioxide and an exfoliation sublayer consisting of $Si_3N_4$, the exfoliation sublayer being adapted to decompose under the action of heating induced by the heating sublayer, the support substrate consisting of silicon, and the composition of the antireflection layer may consist of $SiO_x$, where x varies gradually between 0 and 2.

As indicated above, an antireflection layer may be formed on the upper face of the support substrate. If this is the case, the composition of the antireflection layer may vary gradually over its thickness so that its refractive index n2 is equal to n1 at its interface with the support substrate and is equal to n0 at its upper surface on the opposite side from the interface with the support substrate, n0 being the refractive index of the medium in which the composite structure is placed during the irradiation.

This gradual variation of the composition advantageously makes it possible to avoid significant jumps in optical index at the interface between the upper face of the support substrate and the surrounding medium in which the composite structure is placed. The reflections at the upper face of the support substrate will thus be minimized, which makes it possible to have maximum light energy transmitted to the separation layer during the separation method.

Furthermore, when an antireflection layer is formed at the interface between the support substrate and the separation layer, the thickness (denoted e1) of the antireflection layer is preferably substantially equal to $(2M+1)\cdot\lambda/4$, M being an odd integer greater than or equal to 0 and $\lambda$ being the determined wavelength. Even more preferably, $e1=(2M+1)\cdot\lambda/4$. By adjusting the thickness of the antireflection layer in this way, it is possible to reduce its reflection to a minimum.

According to a second embodiment of the invention, the treatment step comprises the formation of at least one rough layer at the interface between the support substrate and the separation layer and/or on the upper face of the support substrate, the rough layer having a mean roughness level greater than or equal to 50 Å rms over a measurement field equal to at least three times the dimension of the upper zone of the face to be irradiated with the radiation.

The formation of such a rough layer advantageously makes it possible to modify the physical properties at the interface in question, the latter being converted from the specular state to the diffuse state. This makes the composite structure of the invention insensitive or not very sensitive to both constructive and destructive optical interference (see below).

The formation of the rough layer may be carried out at least by mechanical grinding or chemical etching.

In relation to this, the present invention also relates to a method for separating a layer from a composite structure of the invention as described above. The separation method comprises irradiation of the separation layer through the support substrate of the structure by means of incident light corresponding to the wavelength at which the support substrate is at least partially transparent, in order to induce weakening or separation by exfoliation of the separation layer.

The invention also relates to a composite structure comprising a composite stack formed from at least:
  a support substrate formed from a material that is at least partially transparent at a determined wavelength;
  a layer to be separated by irradiation; and
  a separation layer interposed between the support substrate and the layer to be separated, the separation layer being adapted to be separated by exfoliation under the action of radiation having a wavelength corresponding to the determined wavelength,
  the composite structure furthermore comprising at least one layer modifying the optical properties in reflection at the interface between the support substrate and the separation layer or on the upper face of the support substrate on the opposite side from the face of the substrate in contact with the separation layer.

The embodiments and advantages explained above with reference to the fabrication method according to the invention apply similarly to the composite structure of the invention.

According to a particular embodiment, each layer modifying the optical properties in reflection corresponds, respectively, to an antireflection layer and/or to a rough layer having a mean roughness level greater than or equal to 50 Å rms over a field of 5 μm×5 μm.

Furthermore, the structure may comprise at least one layer modifying the optical properties in reflection corresponding to an antireflection layer, and at least one layer modifying the optical properties in reflection corresponding to a rough layer.

BRIEF DESCRIPTION OF THE DRAWINGS

Other characteristics and advantages of the present invention will become apparent from the description given below with reference to the accompanying drawings, which illustrate an exemplary embodiment thereof, implying no limitation. In the figures.

DETAILED DESCRIPTION

The present invention relates to a composite structure that can be separated by exfoliation under good conditions, even for compositions that traditionally do not offer good results.

The applicants have carried out a study that has made it possible to demonstrate the physical mechanism giving rise to the difficulties encountered for carrying out a method of separation by exfoliation. The study has, in particular, demonstrated the role of the optical interference occurring in the support substrate during the irradiation of the composite structure.

Figure 1:
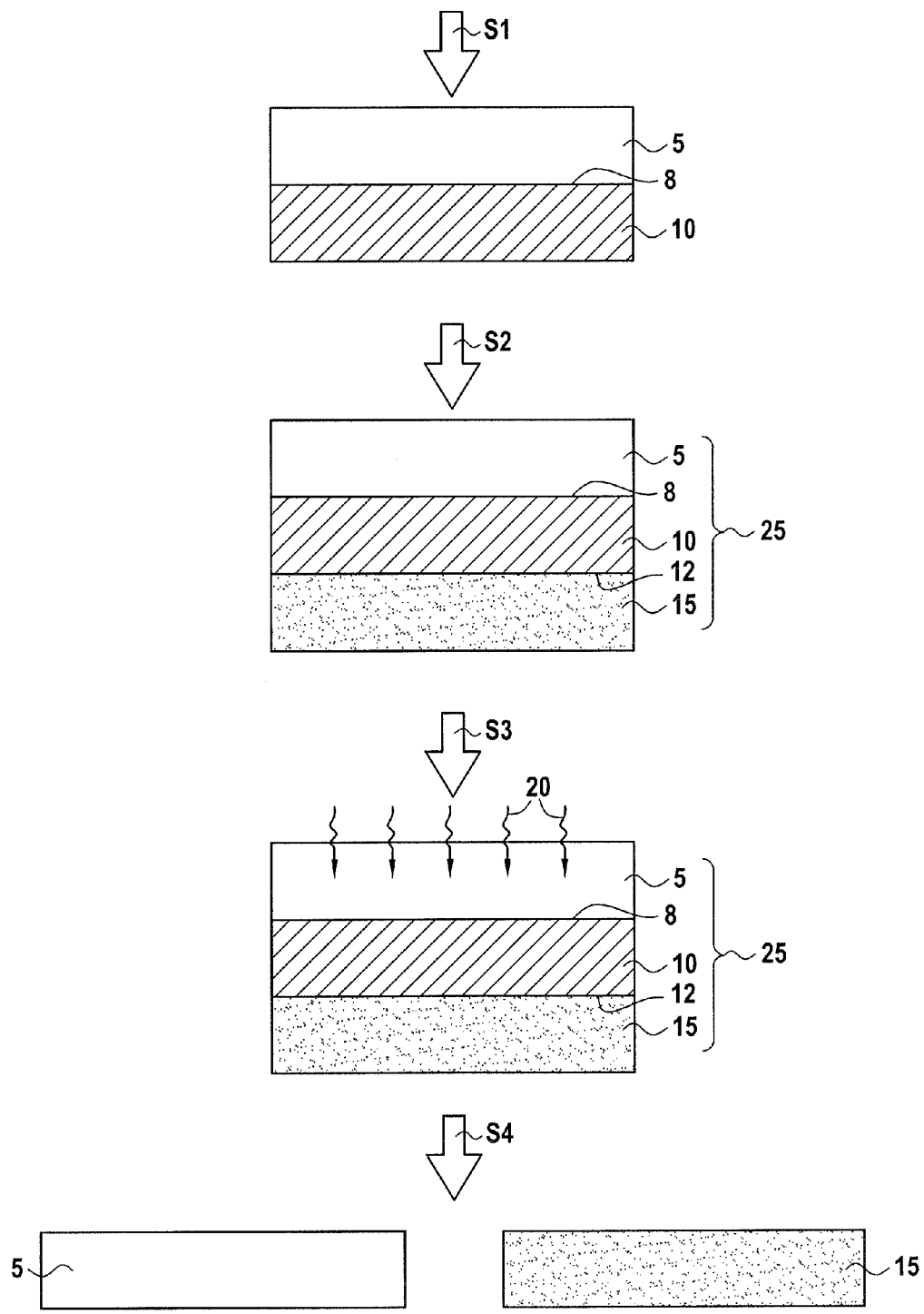
FIG. 1 schematically represents a known method (steps S1 and S2) for fabricating a composite structure, as well as a method (steps S3 and S4) of separation by exfoliation applied to the structure.

This mechanism will now be described with reference to FIG. 2. This figure represents the composite structure 25 as described above with reference to FIG. 1.

Figure 2:
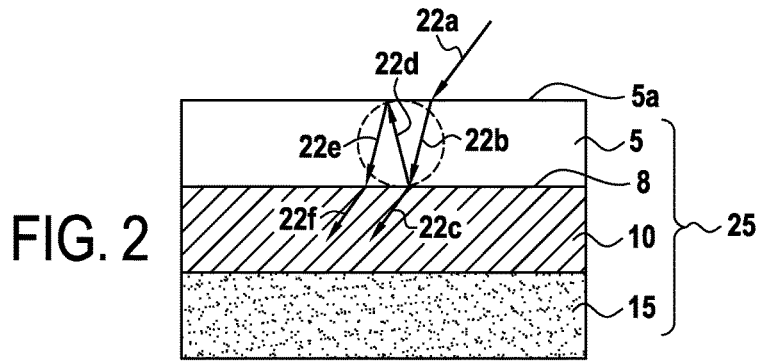
FIG. 2 schematically illustrates the mechanism of the creation of optical interference in the support substrate of a composite structure.

FIG. 2 represents, in particular, an incident light ray 22a reaching the exposed surface 5a of the support substrate 5 during the irradiation step S3. As for any light ray encountering a semi-absorbent medium, a part (not represented) of the light ray 22a is reflected at the upper surface 5a of the substrate 5 while a part 22b is transmitted into the support substrate 5. During its passage through the thickness of the support substrate 5, a part of the transmitted ray 22b is absorbed and the remaining part reaches the interface 8 between the support substrate 5 and the separation layer 10. The interface 8 again functions as an optical diopter so that the ray 22b is partially reflected (reflected ray 22d) and the remaining part 22c is transmitted into the separation layer 10. The reflected ray 22d again encounters the upper surface 5a and leads to new processes of internal reflection within the support substrate 5.

However, the various light rays (22b, 22d, 22e . . . ) passing through the thickness of the support substrate 5 interact with one another in order to create, depending on their phase shift, waves with higher intensities (this is referred to as "constructive interference") or waves with lower intensities (this is referred to as "destructive interference"). These interference phenomena give rise to the strong variations and significant reductions observed by the applicants in relation to the radiative energy transmitted by the support substrate to the separation layer.

More particularly, the studies have shown that the level of the interference depends strongly on the jumps in the optical index (or refractive index) that are encountered by the radiation at the exposed surface 5a and at the interface 8. Ideally, the optical index difference between the various materials involved should be minimized. With regard to the compositions of conventional composite structures (namely, $GaN/Al_2O_3$ or $Si_3N_4/Al_2O_3$), the situation is particularly favorable since the index jumps are at most 0.87 for radiation with a wavelength of between 150 nm and 300 nm (the optical indices of sapphire and $Si_3N_4$ being 1.87 and 2.27, respectively).

On the other hand, the situation is much less favorable for an $SiO_2/Si$ composition in which the optical indices of silicon dioxide and silicon are, respectively, 1.992 and 3.42 for radiation having a wavelength of more than 1.5 µm. If the exposed surface 5a is in contact with air (with an index equal to 1), then, for example, very large jumps in optical index are obtained (of the order of 2.4 or 1.4 between each of the layers) for radiation with a wavelength of 9.3 µm. These large jumps in optical index contribute to generating very strong variations in the light intensity transmitted to the separation layer 10 during step S3.

Furthermore, the level of sensitivity to interference in relation to the thickness of the support substrate is extreme in the above case of a separation layer consisting of silicon dioxide and a support substrate consisting of silicon. Specifically, a maximum transmitted intensity is observed with a silicon thickness period of 1.35 µm. In other words, when considering a thickness L of the support substrate consisting of silicon for which a transmission maximum is reached, a transmission minimum will, in principle, be obtained for a thickness L+1.35/2 µm and a new transmission maximum will be reached for a thickness L+1.35 µm. This means that it would be necessary to control the thickness of the support substrate consisting of silicon with a level of precision much better than 0.675 µm in order to avoid significant variations in transmission of the radiation into the separation layer. Such a level of control is not currently envisageable for support substrates consisting of silicon, the thickness of which generally varies with an amplitude of the order of 5 µm and 1.5 µm for a wafer diameter of 200 mm and 300 mm, respectively (Total Thickness Variation or "TTV").

The level of control over the thickness for substrates such as those consisting of silicon is, therefore, insufficient, which contributes to the problem of the variations in transmitted energy as explained above.

The problems of transmission and optical interference have not hitherto been dealt with effectively, in particular, because they have a limited impact on composite structures of traditional composition. The applicant has, therefore, developed a new composite structure making it possible to overcome the aforementioned drawbacks, and to do so irrespective of the composition of the structure in question.

A composite structure according to a first embodiment of the invention will now be described with reference to FIGS. 3A and 3B. These figures represent an example of a fabrication method (steps S10 to S14) making it possible to obtain this composite structure, as well as a method of separation by exfoliation (steps S16 to S18) applied to the structure.

Figure 3A:
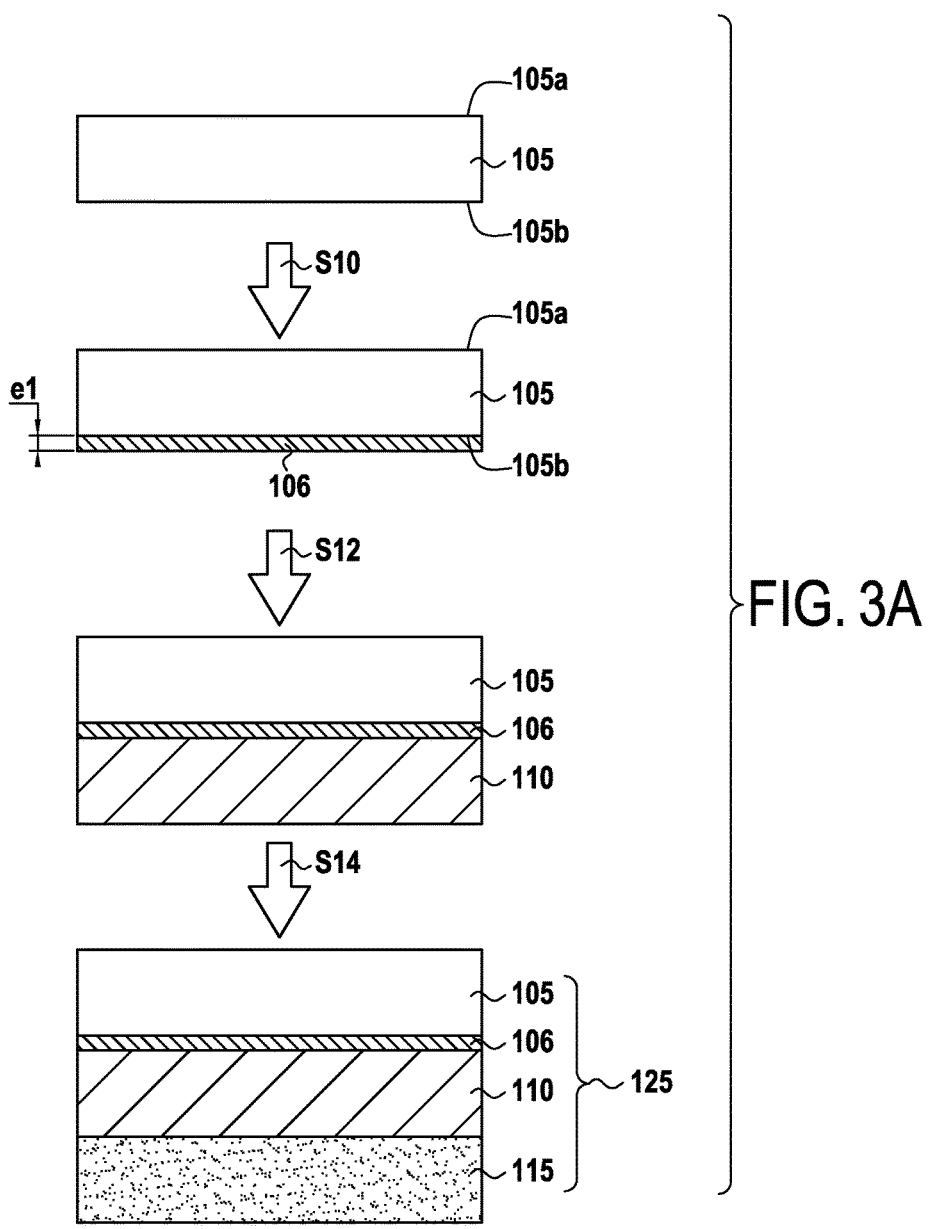
FIGS. 3A and 3B schematically represent a method (steps S10-S14) for fabricating a composite structure according to a first embodiment of the invention, as well as a method (S16-S18) of separation by exfoliation applied to the structure.
Figure 3B:
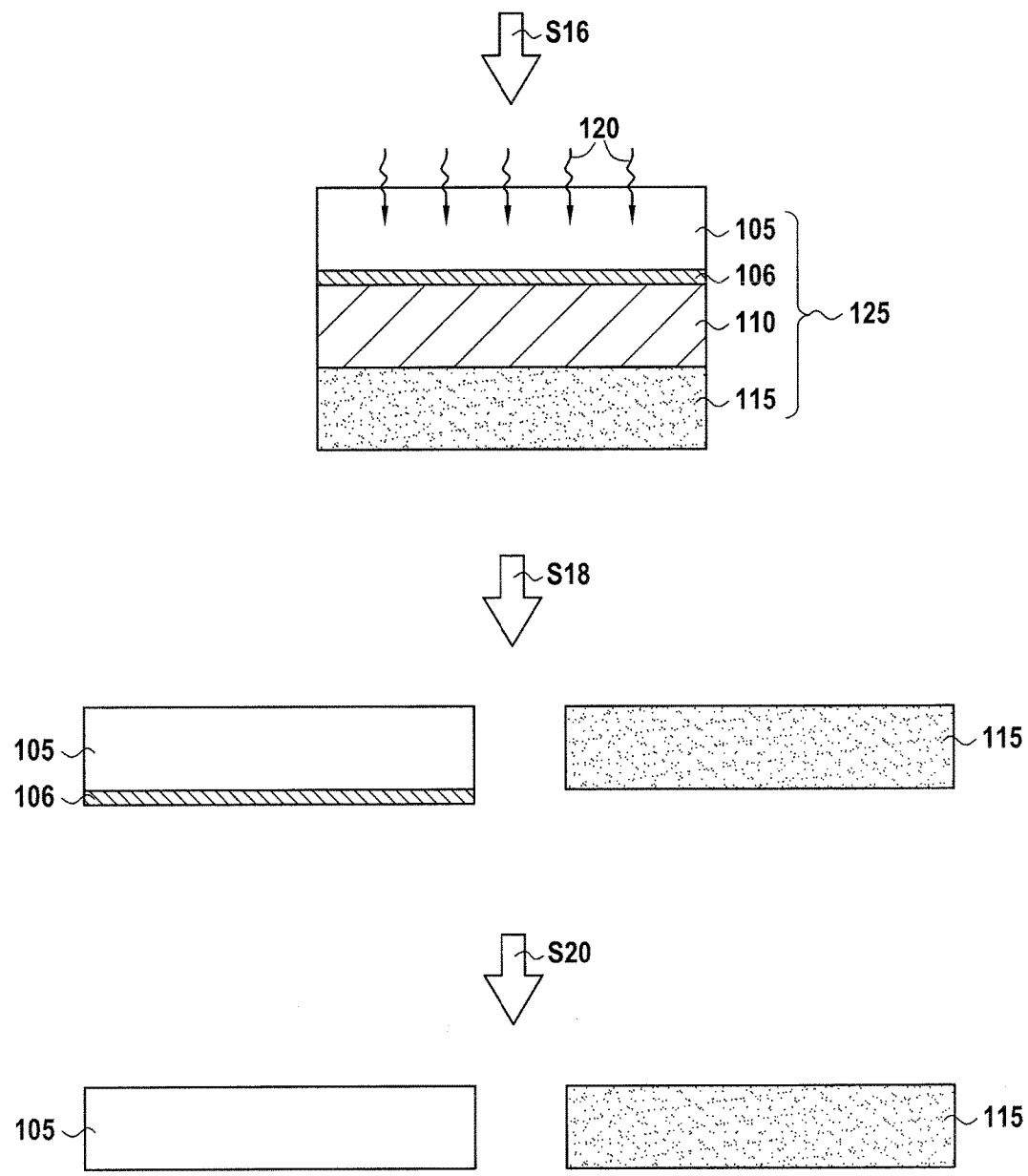

As represented in FIG. 3A, an antireflection layer 106 of thickness e1 is first formed by deposition on the surface 105b of the support substrate 105 (step S10). The antireflection layer 106 may be produced by any suitable deposition technique (for example, PECVD or LPCVD deposition) or any other suitable layer formation technique. It is also conceivable to assemble the antireflection layer 106 by bonding on the surface 105b of the support substrate 105. The purpose and the characteristics of this antireflection layer 106 will be explained in more detail below.

In the example described here, the support substrate 105 consists of silicon.

A separation layer 110 is subsequently assembled by bonding on the exposed face of the antireflection layer 106, that is to say, the face on the opposite side from the one in contact with the support substrate 105 (step S12).

A layer 115 to be separated is also assembled by bonding on the exposed face of the separation layer 110, so as to form the composite structure 125 (step S14).

The layers 110 and 115 are not necessarily assembled by bonding in order to form the composite structure 125. As a variant, at least one of the layers 110 and 115 may be formed by means of a suitable deposition technique. The separation layer 110 may, for example, be formed by PECVD or LPCVD deposition.

Once the structure 125 has been formed, the layer 115 may be detached from the support substrate 105 by separating the separation layer 110 by exfoliation (steps S16 and S18). It will be noted that the composite structure 125 may be subjected to complementary technology steps before the method of separation by exfoliation is carried out. One or more layers may, in particular, be formed or assembled on the exposed face of the layer 115 (for example, a final substrate), optionally after technology steps have been carried out on the rear face of the layer 115 (formation of components, etc.).

In order to separate the layer 115 from the support substrate 105, electromagnetic radiation 120 is first applied onto the separation layer 110 through the support substrate 105 (step S16). This radiation, in the form of a beam, has a wavelength 2 at which the support substrate 105 is at least partially transparent. At this wavelength, the substrate 105 has a transmittance of at least 10%, and preferably greater than or equal to 50%. It is, however, possible to compensate for a low transmittance by increasing the amount of energy of the beam applied during step S16 (for example, by focusing the beam).

In the example envisaged here, the separation layer 110 may comprise a first so-called "heating sublayer" (for example, consisting of silicon dioxide) and a second so-called "exfoliation sublayer" (for example, consisting of $Si_3N_4$). The function of the heating sublayer is to induce heating under the effect of the irradiation during step S16. The function of the exfoliation sublayer is to lead to separation of the separation layer 110 by exfoliation under the effect of the heat energy transmitted from the heating sublayer (by thermal conduction). The exfoliation sublayer is adapted to decompose or weaken under the effect of the heating induced by the heating sublayer during the irradiation.

In a variant, the separation layer 110 comprises at least one sublayer that simultaneously fulfills the function of heating and exfoliation.

With regard to the antireflection layer 106, it has the effect of combining two reflections in phase opposition so that they are destructive, which advantageously makes it possible to reduce or prevent any reflection of the light radiation transmitted by the support substrate 105, while maximizing the transmission to the separation layer 110. The function of the antireflection layer 106 is, therefore, the opposite to that of a layer of the mirror type, which would maximize the reflection at the interface between the support substrate 105 and the separation layer 110. In this regard, the layer 106 constitutes a layer modifying the optical properties in reflection at the interface between the support substrate 105 and the separation layer 110.

As indicated with reference to the composite structure 125, the separation induced by the radiation 120 does not necessarily lead to detachment or actual separation in the separation layer 110, but may simply result in weakening of the layer 110, requiring the subsequent application of additional energy (for example, in the form of mechanical forces) in order to obtain actual detachment between the support substrate 105 and the layer 115.

Once the substrate 105 and the layer 115 have been fully separated (step S18), the support substrate 105 may be recycled with a view to forming a new composite structure. This recycling may optionally involve removal of the antireflection layer 106.

In order to prevent undesirable reflections as much as possible during the irradiation step S16, the antireflection layer 106 should have an optical index n2 close, and preferably equal, to the square root of the product of the optical indices of the layers lying on either side. In other words, the index n2 should satisfy the following condition (1):

$$n2=\sqrt{n1 \cdot n3} \pm 10\%$$

where n1 and n3, respectively, correspond to the optical indices of the support substrate 105 and of the separation layer 110.

The index n2 is preferably selected according to the following condition (2):

$$n2=\sqrt{n1 \cdot n3}$$

In the example envisaged here, it is assumed that n1 and n3 are 3.42 and 1.992, respectively. The optical index n2 of the antireflection layer 106 is, therefore, of the order of 2.61, and preferably equal to this value.

Furthermore, the reflectivity of the antireflection layer 106 depends on its thickness e1. The ideal case in which its reflectivity is minimal is achieved for a layer thickness $e1=(2M+1)\lambda/4$, where M is an integer greater than or equal to 0.

In the example envisaged here, the wavelength λ of the radiation 120 is 9.3 μm. In order for the reflectivity of the antireflection layer 106 to be minimal, it is expedient for its thickness to be about e1=4.6 μm (the case when n1>n3).

Moreover, as indicated above, the level of the reflections depends strongly on the jumps in optical index between the materials involved (i.e., the differences between n1, n2 and n3). According to a variant of this first embodiment, the antireflection layer 106 is such that its optical index n2 varies gradually over the thickness of the layer 106 so as to be equal to the value of n1 at the interface with the support substrate 105 and equal to n3 at the interface with the separation layer 110. To this end, the antireflection layer 106 envisaged here is produced by depositing a layer of Si—$O_x$ gradually richer and richer in silicon dioxide in order to reach the $SiO_2$ stoichiometry (x varying progressively between 0 and 2).

This variant advantageously makes it possible to avoid significant jumps in optical index at the interfaces involved and, therefore, to minimize the reflections at the interface between the antireflection layer 106 and the support substrate 105.

In order to minimize the reflections while optimizing the transmission of the radiation to the separation layer 110, it is possible to produce one or a plurality of nanostructured sublayers in the antireflection layer 106, which are known by the term "moth-eye" and the principle of which is to contain patterns with dimensions very much less than the wavelength λ of the radiation 120 used. These "moth-eye" layers have, in particular, a very low level of reflection for omnidirectional incident light.

These layers of the moth-eye type, which are used particularly in the solar cells, are, for example, described in detail in the document "Characterization of Antireflection Moth-Eye Film on Crystalline Silicon Photovoltaic Module," Noboru Yamada et al., *Optics Express*, vol. 19, Issue S2, pp. A118-A125). Nanostructures of the moth-eye type may, for example, be produced in the form of thin films by plasma treatment or by a complex holographic optical method.

For the different variants described above, it will be noted that it is possible to arrange the antireflection layer 106 on the exposed face 105a of the support substrate 105 instead of being positioned at the interface between the support substrate 105 and the separation layer 110. This variant, however, is less preferred because it allows at least one internal reflection of the light ray in the support substrate 105, namely, reflection of the ray reaching the interface between the support substrate 105 and the separation layer 110 for the first time.

In order to be optimal, the latter variant should satisfy condition (1), and preferably condition (2), which were mentioned above in connection with the optical indices n1, n2 and n3. In the example envisaged here, n2 should, therefore, be equal to 2.61. Furthermore, the thickness (denoted e1') is preferably such that $e1'=(2P+1)\lambda/4$, where P is an integer greater than or equal to 0. Thus, for a wavelength λ of 9.3 μm, the antireflection layer 106 arranged on the face 105a of the support substrate 105 is preferably an SiON alloy with an optical index of 2.61 and a thickness of 2.32 μm, 6.98 μm, etc.

Alternatively, when an antireflection layer 106 is formed on the upper face 105a of the support substrate 105, the composition of the antireflection layer 106 may vary gradually over its thickness so that its refractive index n2 is equal to n1 at its interface with the support substrate 105 and is equal to n0 at its upper surface (i.e., its exposed surface) on the opposite side from the interface with the support substrate 105, n0 being the refractive index of the surrounding medium in which the composite structure 125 is placed during the irradiation.

This index gradient advantageously makes it possible to avoid significant jumps in optical index at the interfaces involved and, therefore, to minimize the reflections at the interface between the antireflection layer 106 and the support substrate 105.

A composite structure according to a second embodiment of the invention will now be described with reference to FIGS. 4A, 4B, 5A and 5B.

More particularly, these figures represent an example of a fabrication method (steps S110 to S114), making it possible to obtain a composite structure 225, as well as a method of separation by exfoliation (steps S116 to S118) applied to the composite structure 225.

Figure 4A:
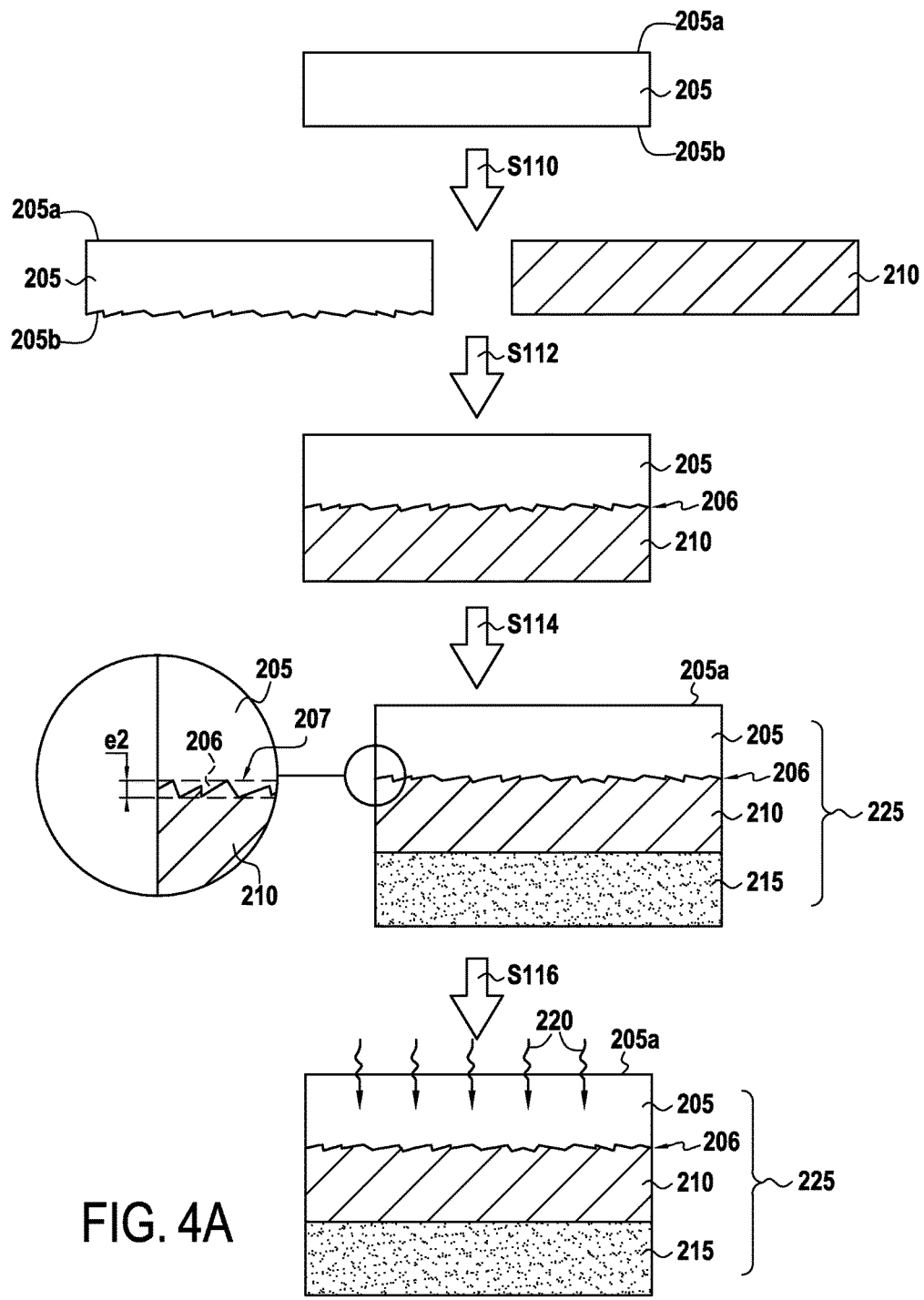
FIGS. 4A and 4B schematically represent a method (steps S110-S114) for fabricating a composite structure according to a second embodiment of the invention, as well as a method (S116-S118) of separation by exfoliation applied to the structure.
Figure 4B:
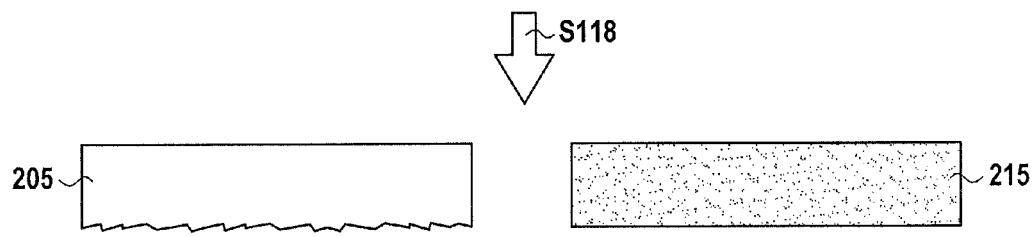

As represented in FIG. 4A, the support substrate 205 is first subjected to a roughening step S110, making it possible to increase the roughness of one of its surfaces (denoted 205b). The mean roughness reached on the surface 205b is preferably greater than or equal to 50 Å Luis (Å for "ångström" and rms for "root mean square"), and even more preferably at least equal to 100 Å rms over a measurement field (or surface) equal to at least three times the dimension of the zone irradiated (during the subsequent irradiation step S116). Specifically, the level of roughness should be high over a field with, for example, the dimensions of a laser spot (i.e., 1 µm×1 µm, for example). This measurement field may, for example, be 5 µm×5 µm.

This roughening is, for example, produced with the aid of a chemical method of the etching type (for example, TMAH etching when the support substrate 205 consists of silicon) or a method of the mechanical type, such as mechanical abrasion or grinding, sandblasting, polishing, etc. Alternatively, a combination of at least two of these methods may be used in order to achieve the desired level of roughness and surface condition.

The separation layer 210 is then assembled by bonding on the rough face 205b of the support substrate 205 (step S112). An interface 206 between the support substrate 205 and the separation layer 210 is thus obtained, which is characterized by an increased roughness at least equal to 50 Å rms, or even 100 Å rms, over a field equal to at least three times the irradiated zone (for example, a field of 5 µm×5 µm). This high level of roughness extends over a layer (or zone) 207 of thickness e2 lying at the interface 206 between the support substrate 205 and the layer 210 to be separated. This zone 207 corresponds to a layer consisting of the materials of the support substrate 205 and of the separation layer 210, which lie on either side of the interface 206 over a thickness e2. This thickness e2 may, for example, be more than 300 Å and, for example, reach a value of 500 Å.

In the example described here, the support substrate 205 consists of silicon. Furthermore, the separation layer 210 is identical to the separation layer 110. It comprises, for example, a heating sublayer consisting of silicon dioxide and an exfoliation sublayer consisting of $Si_3N_4$ (not represented in the figures).

Once the step S112 has been carried out, a layer 215 is assembled by bonding on the exposed face (i.e., the rear face on the opposite side from the face in contact with the support substrate 205) of the separation layer 210 (step S114).

It will be noted that the layers 210 and 215 are not necessarily assembled by bonding in order to form the composite structure 225. As a variant, at least one of the layers 210 and 215 may be formed by means of a suitable deposition technique. The separation layer 210 may, for example, be formed by PECVD or LPCVD deposition.

Once the structure 225 has been formed, it is possible to detach the layer 215 from the support substrate 205 (steps S114 and S116) by carrying out a method of separation by exfoliation identical to the one described above with reference to the composite structure 125.

The composite structure 225 may be subjected to complementary technology steps before the method of separation by exfoliation is carried out. One or more layers may, in particular, be formed or assembled on the exposed face of the layer 215 (for example, a final substrate), optionally after technology steps have been carried out on the rear face of the layer 215 (formation of components, etc.).

In order to separate the layer 215 from the support substrate 205, electromagnetic radiation 220 is first applied onto the separation layer 210 through the support substrate 205 (step S116). This radiation has a wavelength λ at which the support substrate 205 is at least partially transparent. At this wavelength, the substrate 205 has a transmittance of at least 10%, and preferably greater than or equal to 50%. As indicated with reference to the substrate 105, however, it is possible to compensate for a low transmittance of the support substrate 205 by increasing the energy of the beam applied during the irradiation step S116.

The effect of the roughening previously carried out is to modify the physical properties at the interface 206, the latter being converted from the specular state to the diffuse state. The rough layer 207 modifies, in particular, the optical properties in reflection at the interface 206 of the composite structure 225. By virtue of this rough layer 207, the composite structure 225 is insensitive, or not very sensitive, to both constructive and destructive optical interference. The layer 206, therefore, constitutes a layer modifying the optical properties in reflection at the interface between the support substrate 205 and the separation layer 210.

It should be noted that, according to an alternative, it is possible to roughen the separation layer 210 before assembly with the support substrate 205. The surface 205b of the support substrate 205 and the surface of the separation layer 210, which is intended to come into contact with the surface 205b, may also be roughened. In all cases, the level of roughness obtained on the layer 207 is as described above.

Figure 5A:
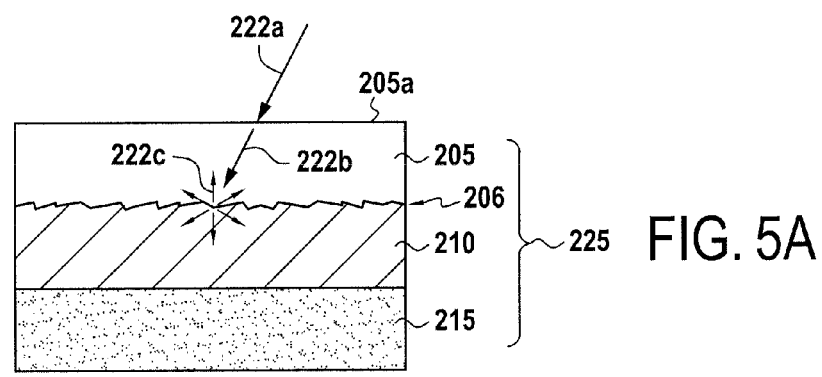
FIGS. 5A and 5B schematically represent irradiation of a composite structure according to two variants of the second embodiment of the invention.

As represented in FIG. 5A, when an incident light ray 222a reaches an exposed surface 205a of the composite structure 225 in step S116, a part 222b of the ray is transmitted in the support substrate 205 as far as the interface 206. The effect of the interface 206 is to make the interface 206 diffuse, so that the ray 222b is scattered in different directions at the interface 206. The scattered rays 222c are thus transmitted partially into the separation layer 210 along multiple directions, the remaining part being scattered into the support substrate 205. This scattering makes it possible to avoid multiple reflections occurring in the support substrate 205 of the composite structure 225, these reflections giving rise to undesirable optical interference.

Although a part of the incident radiant energy is not transmitted to the separation layer 210, this embodiment is nevertheless advantageous in that it makes it possible to suppress the sensitivity of the composite structure 225 to variations in transmitted energy as a function of the thickness of the support substrate 205.

As indicated with reference to the structures 25 and 125, the separation induced by the radiation 220 does not necessarily give rise to detachment or actual separation in the separation layer 210, but may simply give rise to weakening of the layer 210, requiring the subsequent application of additional energy (for example, in the form of mechanical forces) in order to obtain actual detachment between the support substrate 205 and the layer 215.

Once the substrate 205 and the layer 215 have been fully separated (step S118), the support substrate 205 may be recycled with a view to forming a new composite structure. This recycling may optionally involve removal of the rough layer 207 by polishing the surface 205b of the support substrate 205 (or by any other suitable method).

Figure 5B:
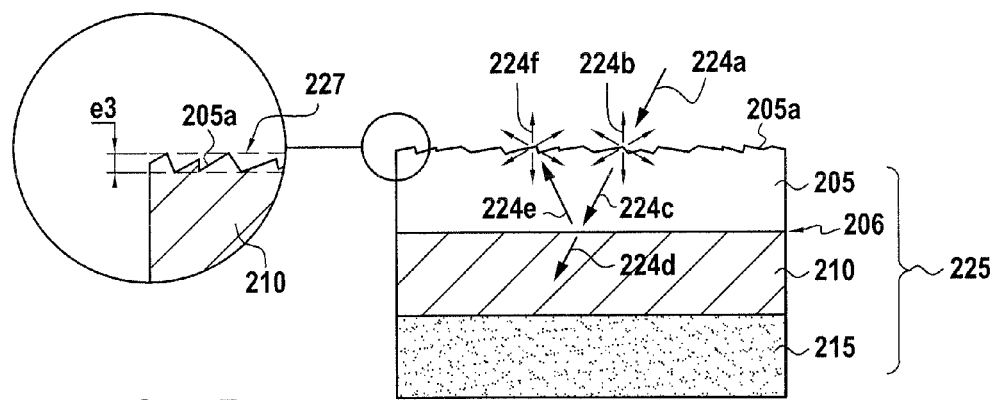

According to a variant, represented in FIG. 5B, of this second embodiment, it is the exposed surface 205a of the support substrate 205 that is roughened before, during and/or after formation of the composite structure 225. A layer with increased roughness is thus obtained (with the same value as that defined for the first variant) over a zone of thickness e3 on the exposed surface 205a. This zone constitutes a layer 227 modifying the optical properties in reflection of the composite structure 225. The thickness e3 is of the same order of value as the thickness "e2".

In this variant, the effect of the rough surface 205a (and more generally the rough layer 207) is to scatter each light ray 224a irradiated during step S116 in multiple directions.

Among the scattered rays 224b, a ray 224c is transmitted to the interface 206. A part 224d of this ray is then transmitted into the separation layer 210. This variant, however, has a drawback in relation to that of FIG. 5A, in that a reflection cannot be avoided at the interface 206 between the support substrate 205 and the separation layer 210. The ray 224e reflected by the interface 206 is accordingly radiative energy not transmitted to the separation layer 210.

The ray 224e is subsequently scattered by the rough layer 227 on the surface 205a, which makes it possible to avoid multiple reflections occurring in the support substrate 205. This variant, therefore, also makes it possible to prevent the generation of detrimental optical interference in the thickness of the support substrate 205.

The composite structure of the present invention, therefore, advantageously makes it possible to reduce the variations in energy transmitted during the irradiation step as a function of the thickness of the support substrate and to maximize the amount of energy actually transmitted into the separation layer. The quality and reproducibility of the separation by exfoliation between the support substrate and the layer to be separated are thereby thus greatly improved. The invention makes it possible, in particular, to carry out separations by exfoliation on composite structures that have compositions different from those generally used and that are particularly sensitive to optical interference.

As other variants, it is conceivable to arrange an antireflection layer 106 on each of the faces of the support substrate of the composite structure, so as to modify the optical properties in reflection of the substrate on both of its faces (i.e., on its exposed surface and at the interface with the separation layer).

It is also possible to roughen the two faces of the support substrate (in which case the support substrate comprises a rough layer 207 and a rough layer 227). This variant, however, leads to a more significant loss in terms of radiative energy transmission during the irradiation step.

Alternatively, the support substrate may have an antireflection layer on one of its faces, the other surface being roughened as described above.

It will furthermore be noted that the support substrate and each of the layers forming the composite structure according to the invention may consist of a plurality of sublayers. In particular, as described above, the antireflection layer 106 may be formed by two or more sublayers.

According to another variant of the invention, the composite structure may comprise both an antireflection layer 106 at the interface between the support substrate and the separation layer and a rough layer 227 on the upper (i.e., exposed) face of the support substrate, or conversely, a rough layer at the interface between the support substrate and the separation layer and an antireflection layer on the upper face of the support substrate.

The invention claimed is:

1. A method for fabricating a composite structure including a layer to be separated by irradiation, the method comprising:

forming a separation layer between the layer to be separated by irradiation and a support substrate at least partially transparent to a selected wavelength of radiation, the separation layer comprising a heating sublayer configured and formulated to produce heat upon exposure to the selected wavelength of radiation and an exfoliation sublayer configured and formulated to be weakened by the heat produced by the heating sublayer; and forming an antireflection layer at the interface between the support substrate and the separation layer so as to modify the reflective optical properties of the interface between the support substrate and the separation layer, and selecting a composition of the antireflection layer such that a refractive index of the antireflection layer is at least substantially equal to $\sqrt{n1 \times n3}$, where n1 is a refractive index of the support substrate and n3 is a refractive index of the separation layer.

2. The method of claim 1, further comprising selecting a composition of the antireflection layer such that a refractive index of the antireflection layer is equal to $\sqrt{n1 \times n3}$.

3. The method of claim 1, wherein the support substrate comprises silicon, the heating sublayer comprises silicon dioxide, the exfoliation sublayer comprises $Si_3N_4$, and the antireflection layer comprises SiON, a refractive index of the antireflection layer being at least substantially equal to 2.61.

4. The method of claim 1, wherein a composition of the antireflection layer varies gradually over a thickness of the antireflection layer such that a refractive index of a portion of the antireflection layer adjacent the support substrate is equal to a refractive index of the support substrate, and such that the refractive index of another portion of the antireflection layer adjacent the separation layer is equal to a refractive index of the separation layer.

5. The method of claim 4, further comprising:
selecting the support substrate to comprise silicon;
forming the heating sublayer to comprise silicon dioxide;
forming the exfoliation sublayer to comprise $Si_3N_4$; and
forming the antireflection layer to comprise $SiO_x$, wherein x varies gradually across a thickness of the antireflection layer between 0 and 2.

6. The method of claim 5, wherein a thickness of the antireflection layer at the interface between the support substrate and the separation layer is at least substantially equal to $(2M+1) \cdot \lambda/4$, wherein M is any odd integer greater than or equal to 0 and $\lambda$ is the selected wavelength of radiation.

7. The method of claim 1, further comprising forming another antireflection layer on the outer face of the support substrate, wherein a composition of the another antireflection layer varies gradually over a thickness of the another antireflection layer such that a refractive index of a portion of the another antireflection layer adjacent support substrate is equal to a refractive index of the support substrate, and such that the refractive index of another portion of the another antireflection layer adjacent a medium in which the composite structure is placed during the irradiation is equal to the refractive index of the medium.

8. A method for fabricating a composite structure including a layer to be separated by irradiation, the method comprising:

forming a separation layer between the layer to be separated by irradiation and a support substrate at least partially transparent to a selected wavelength of radiation, the separation layer comprising a heating sublayer configured and formulated to produce heat upon exposure to the selected wavelength of radiation and an exfoliation sublayer configured and formulated to be weakened by the heat produced by the heating sublayer; and forming an interface between the support substrate and the separation layer to have a mean roughness level greater than or equal to 50 Å rms over a measurement field equal to at least three times a dimension of a zone to be irradiated with the selected wavelength of radiation.

9. The method of claim 8, wherein forming the interface between the support substrate and the separation layer to have a mean roughness level greater than or equal to 50 Å rms comprises subjecting the interface to least one of a mechanical grinding process and a chemical etching process.

10. The method of claim 1, further comprising irradiating the separation layer through the support substrate with incident light having the selected wavelength of radiation to at least weaken the exfoliation sublayer of the separation layer.

11. The method of claim 1, wherein the exfoliation sublayer is configured and formulated to decompose under the heat produced by the heating sublayer.

12. The method of claim 1, wherein the support substrate consists of silicon, the heating sublayer consists of silicon dioxide, and the exfoliation sublayer consists of silicon nitride.

13. The method of claim 1, wherein the selected wavelength of radiation is 9.3 micrometers.

14. The method of claim 1, further comprising forming the antireflection layer so as to be between and in direct physical contact with each of the support substrate and the separation layer.

15. The method of claim 14, further comprising forming the antireflection layer to have a refractive index equal to $\sqrt{n1 \times n3}$.

16. The method of claim 1, further comprising roughening at least one surface of one or more of the support substrate and the separation layer such that the interface between the support substrate and the separation layer has a mean roughness level within a range of from 50 Å rms to 100 Å rms.

* * * * *

UNITED STATES PATENT AND TRADEMARK OFFICE
CERTIFICATE OF CORRECTION

PATENT NO. : 9,646,825 B2  
APPLICATION NO. : 14/345558  
DATED : May 9, 2017  
INVENTOR(S) : Christophe Figuet and Christophe Gourdel Page 1 of 1

It is certified that error appears in the above-identified patent and that said Letters Patent is hereby corrected as shown below:

In the Specification

| | | | |
|---|---|---|---|
| | Column 6, | Line 18, | change "(S16-S18) of" to --(S16 and S18) of-- |
| | Column 6, | Line 23, | change "(S116-S118) of" to --(S116 and S118) of-- |
| | Column 7, | Line 62, | change "(steps S16 to S18)" to --(steps S16 and S18)-- |
| | Column 8, | Line 37, | change "wavelength 2 at" to --wavelength λ at-- |
| | Column 9, | Line 18, | change "reflection layer 106." to --reflection layer 106 (step S20).-- |
| | Column 10, | Line 59, | change "(steps S116 to S118)" to --(steps S116 and S118)-- |
| | Column 13, | Line 10, | change "surface 205a," to --surface 205a, forming scattered rays 224;-- |

In the Claims  
Claim 7, Column 14, Line 44, change "adjacent support" to --adjacent the support--  
Claim 9, Column 15, Line 4, change "to least one" to --to at least one--

Signed and Sealed this  
Twenty-seventh Day of March, 2018

Andrei Iancu  
*Director of the United States Patent and Trademark Office*